(12) United States Patent
Zojer et al.

(10) Patent No.: US 9,252,140 B2
(45) Date of Patent: Feb. 2, 2016

(54) SEMICONDUCTOR CHIP AND SEMICONDUCTOR ARRANGEMENT

(75) Inventors: Gerhard Zojer, Schiefling am Woerthersee (AT); Daniel Auer, Millstatt (AT); Gerrit Utz, Regen (DE); Claudia Kabusch, Landskron (AT)

(73) Assignee: Infineon Technologies AG, Neubiberg (DE)

(*) Notice: Subject to any disclaimer, the term of this patent is extended or adjusted under 35 U.S.C. 154(b) by 612 days.

(21) Appl. No.: 13/427,344

(22) Filed: Mar. 22, 2012

(65) Prior Publication Data

US 2013/0249018 A1 Sep. 26, 2013

(51) Int. Cl.
| | |
|---|---|
| H01L 27/088 | (2006.01) |
| H01L 29/66 | (2006.01) |
| H01L 21/70 | (2006.01) |
| H01L 29/06 | (2006.01) |
| H01L 23/34 | (2006.01) |
| H01L 27/02 | (2006.01) |
| H01L 23/367 | (2006.01) |
| B60R 21/017 | (2006.01) |
| H01L 27/06 | (2006.01) |

(52) U.S. Cl.
CPC .......... *H01L 27/0296* (2013.01); *B60R 21/017* (2013.01); *H01L 23/367* (2013.01); *H01L 27/0211* (2013.01); *H01L 27/0629* (2013.01); *H01L 27/088* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,153,697 A | * | 10/1992 | Mosher et al. | 257/296 |
| 5,181,095 A | * | 1/1993 | Mosher et al. | 257/370 |
| 5,497,014 A | * | 3/1996 | Momose | 257/205 |
| 2002/0093033 A1 | * | 7/2002 | Zommer et al. | 257/202 |
| 2005/0275025 A1 | * | 12/2005 | Lanzerstorfer | 257/350 |
| 2006/0267147 A1 | * | 11/2006 | Ota et al. | 257/566 |
| 2008/0211566 A1 | * | 9/2008 | Graovac et al. | 327/419 |

FOREIGN PATENT DOCUMENTS

| | | |
|---|---|---|
| DE | 10 2004 046 630 A1 | 3/2006 |
| JP | 3155669 A | 7/1991 |

* cited by examiner

*Primary Examiner* — Hoang-Quan Ho
(74) *Attorney, Agent, or Firm* — Slater & Matsil, L.L.P.

(57) ABSTRACT

One aspect of the invention relates to a semiconductor chip with a semiconductor body. The semiconductor body has an inner region and a ring-shaped outer region. An electronic structure is monolithically integrated in the inner region and has a controllable first semiconductor component with a first load path and a first control input for controlling the first load path. Further, a ring-shaped second electronic component is monolithically integrated in the outer region and surrounds the inner region. Moreover, the second electronic component has a second load path that is electrically not connected in parallel to the first load path.

16 Claims, 7 Drawing Sheets

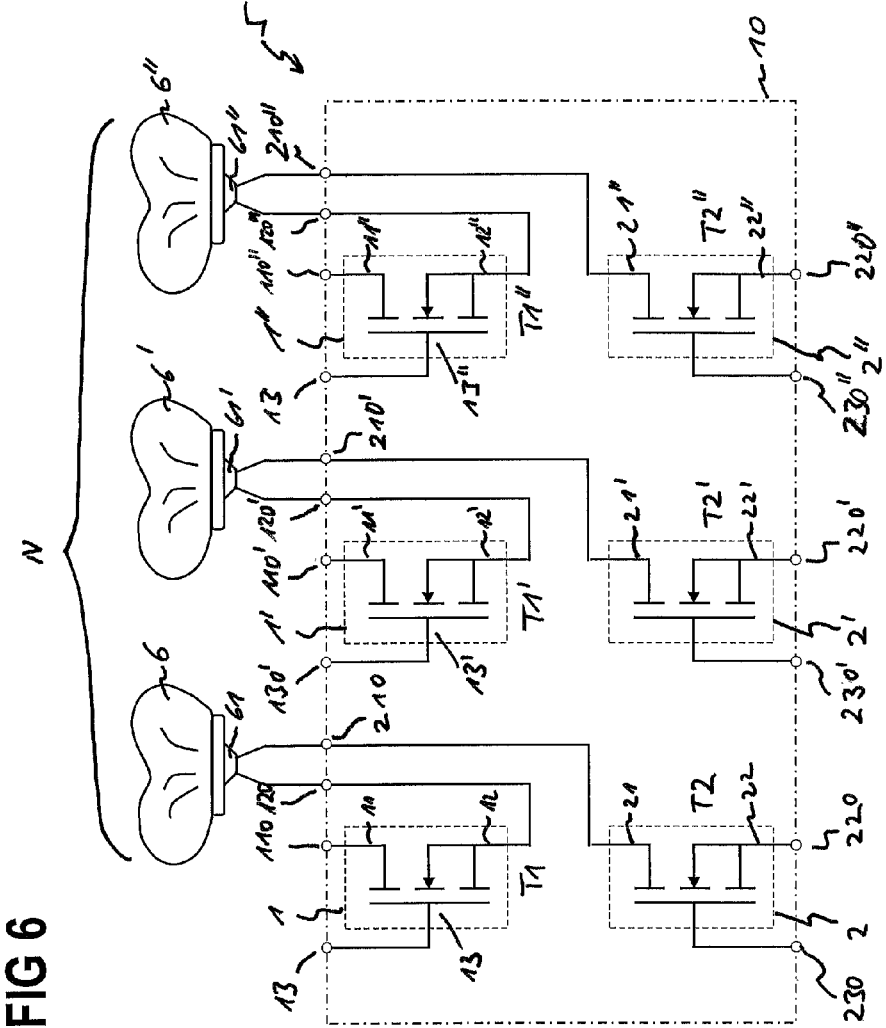
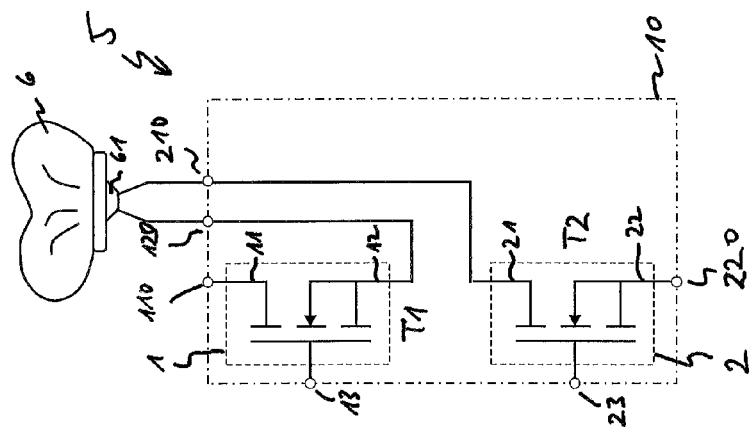
FIG 5
FIG 6

SEMICONDUCTOR CHIP AND SEMICONDUCTOR ARRANGEMENT

TECHNICAL FIELD

Embodiments of the invention relate to a semiconductor chip and to a semiconductor arrangement.

BACKGROUND

Semiconductor devices are used in many electronic and other applications. Semiconductor devices in the form of chips comprise integrated or discrete circuits that are formed from a semiconductor wafer.

During operation in particular of a power semiconductor chip, the semiconductor chip develops waste heat causing an uneven temperature distribution over the chip's semiconductor body. That is, in the center of the flat cuboid the chip temperature is significantly higher than in the border area of the cuboid. In order to avoid the chip temperature to locally exceed a maximum allowable chip temperature, the chip is required to have a minimum size. Hence, the uneven temperature distribution adversely conflicts with the desired reduction of the chip size.

In view of the above-mentioned problems there is a need for an improved semiconductor chip and an improved semiconductor chip arrangement that includes an improved semiconductor chip.

SUMMARY OF THE INVENTION

According to a first aspect, a semiconductor chip includes a semiconductor body that has an inner region and a ring-shaped outer region. An electronic structure is monolithically integrated in the inner region and has a controllable first semiconductor component with a first load path and a first control input for controlling the first load path. Further, a ring-shaped second electronic component is monolithically integrated in the outer region and surrounds the inner region. Moreover, the second electronic component has a second load path that is electrically not connected in parallel to the first load path.

According to a second aspect, a semiconductor chip has a semiconductor body with a number of N≥2 inner regions and a number of N ring-shaped outer regions. Each of the inner regions is surrounded by a corresponding other one of the ring-shaped outer regions. In each of the inner regions, an electronic structure is monolithically integrated and has a controllable first semiconductor component with a first load path and with a first control input for controlling the first load path. Then, for each of the inner regions, an individual ring-shaped second electronic component that has a second load path is monolithically integrated in the corresponding outer region and surrounds the respective inner region. For each of the inner regions and the corresponding outer region, the first load path and the second load path are electrically not connected in parallel.

According to a third aspect, a semiconductor arrangement includes a squib for firing an airbag, and a semiconductor chip. The semiconductor chip includes a semiconductor body with an inner region and with a ring-shaped outer region that surrounds the inner region. A first electronic structure is monolithically integrated in the inner region and has a controllable first semiconductor component with two first load contacts, with a first load path formed between the two first load contacts, and with a first control input for controlling the first load path. A second electronic structure is monolithically integrated in the outer region and has a controllable second semiconductor component with two second load contacts, with a second load path formed between the two second load contacts, and with a second control input for controlling the second load path. The squib is electrically connected between one of the first load contacts and one of the second load contacts.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 5 is a circuit diagram of a semiconductor arrangement that includes a semiconductor chip according to FIGS. 1 and 2, and an airbag electrically connected to the semiconductor chip;

FIG. 6 is a circuit diagram of a semiconductor arrangement that includes a semiconductor chip according to FIGS. 3 and 4, and a number of airbags electrically connected to the semiconductor chip;

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
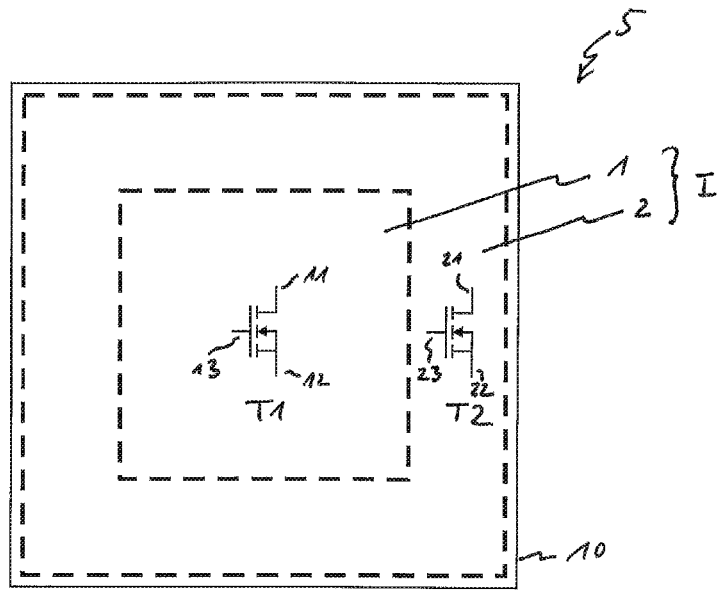
FIG. 1 is a top view of a semiconductor chip with a semiconductor body that schematically illustrates an inner region which is surrounded by a ring-shaped outer region.

Referring now to FIG. 1 there is illustrated a semiconductor chip 5 with a semiconductor body 10. The semiconductor body 10 may include an arbitrary semiconductor base material such as silicon, silicon carbide, gallium, gallium arsenide, gallium nitride, etc. The semiconductor body 10 may further include p-doped and/or n-doped semiconductor zones, metallizations, doped and undoped polycrystalline semiconductor material, dielectric layers like silicon nitride (SiN), silicon oxide ($SiO_2$) etc.

FIG. 1 is a top view of the semiconductor chip 5. In the vertical direction which runs perpendicular to the drawing plane, the semiconductor chip 5 has a thickness which is much smaller than both the length and the width of the semiconductor chip 5. The semiconductor chip 5 may be mounted onto a plane surface such that the vertical direction runs perpendicular to the plane surface.

The semiconductor body 10 has a group I with an inner region 1 and a ring-shaped outer region 2 that completely surrounds the inner region 1. The inner region 1 includes an electronic structure which is monolithically integrated in the inner region 1 and the semiconductor body 10. The electronic structure includes a first component which is a controllable semiconductor component and which exemplary is a field effect transistor T1, for instance a DMOS field effect transistor (DMOS=double-diffused metal-oxide semiconductor). However, any other controllable semiconductor component may be used as first component instead of a field effect transistor T1. For instance, the controllable first component may also be a thyristor, a transistor, in particular a unipolar n-channel or p-channel transistor, or bipolar npn or pnp transistor.

The controllable first component T1 has a first load path formed between two first load contacts 11 and 12, and a first control input 13 for controlling the first load path. Generally, the first load contacts 11 and 12 may be drain and source, source and drain, collector and emitter, emitter and collector, anode and cathode, or cathode and anode. The first control input may be gate or basis.

The outer region 2 includes a ring-shaped second electronic component that is monolithically integrated in the outer region 2 and the semiconductor body 10. The ring-shaped second electronic component, which, for example, is a field effect transistor T2, for instance a DMOS field effect transistor, surrounds the inner region 1. Further, the ring-shaped second electronic component has a second load path that is electrically not connected in parallel to the first load path.

Instead of a field effect transistor T2, any other electronic component that has a load path may be used as second component. For instance, the second component may be a controllable semiconductor component like a thyristor or a transistor, in particular a unipolar n-channel or p-channel transistor, or bipolar npn or pnp transistor. However, the second semiconductor component may also be a non controllable component like a diode or a resistor.

In the embodiment of FIG. 1, the second load path is formed between two second load contacts 21 and 22. Optionally, the second load path may be controlled via a second control input 23.

Different from conventional semiconductor chips, in a semiconductor chip according to the present invention, the components that produce the most waste heat are arranged in the outer region. As a result, the chip temperature is distributed more evenly over the foot print area of the semiconductor body 10 than in a conventional semiconductor chip that has the same functionality as the semiconductor chip 5 and a semiconductor body of the same size as the semiconductor body 10.

During the operation of the semiconductor chip 5, a maximum temperature T5max of the semiconductor body 10 may occur in an outer region 2. Optionally, in the respective inner region 1 that is enclosed by the outer region 2, may have a maximum temperature T1max which is less than T5max. For instance, the difference T5max−T1max may be at least 10° C. or at least 20° C. T5max may be, e.g., at least 400° C. and T1max less than 200° C.

In a state in which the semiconductor chip 5 is not electrically connected by external circuitry, the first electronic component T1 may be either electrically insulated from or electrically connected to the second electronic component T2.

Figure 2:
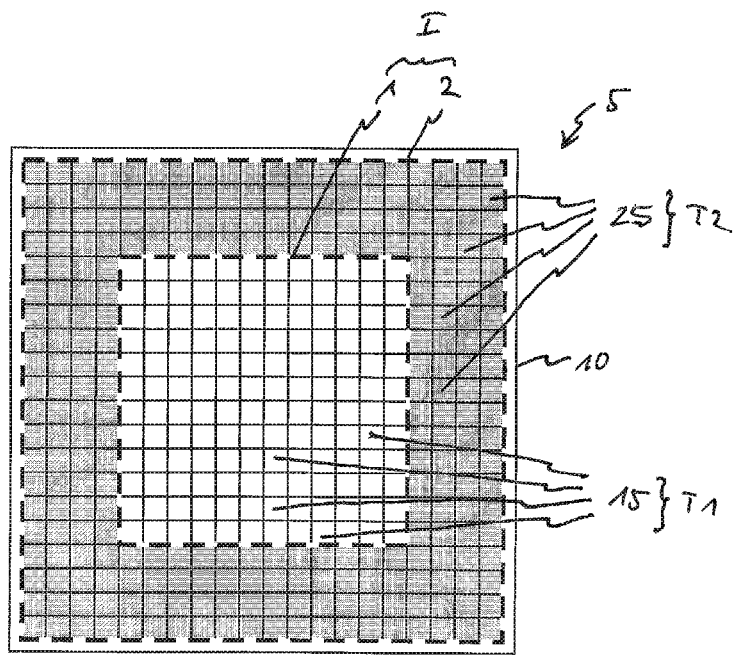
FIG. 2 is a top view of a semiconductor chip according to FIG. 1 which schematically illustrates a controllable first semiconductor component that is arranged in the inner region and that has a cell structure, and a ring-shaped controllable second semiconductor component that is arranged in the outer region, that surrounds the inner region, and that has a cell structure.

As illustrated in FIG. 2, both the first electronic component T1 and the second electronic component T2 may have a cell structure. In such embodiments, the first electronic component T1 may include a number of first transistor cells 15 which are electrically connected in parallel and can be controlled via a common control input 13 (see FIG. 1) of the first electronic component T1. Accordingly, the second electronic component T2 may include a number of second transistor cells 25 which are electrically connected in parallel and can be controlled via a common control input 23 (see FIG. 1) of the second electronic component T2.

Figure 3:
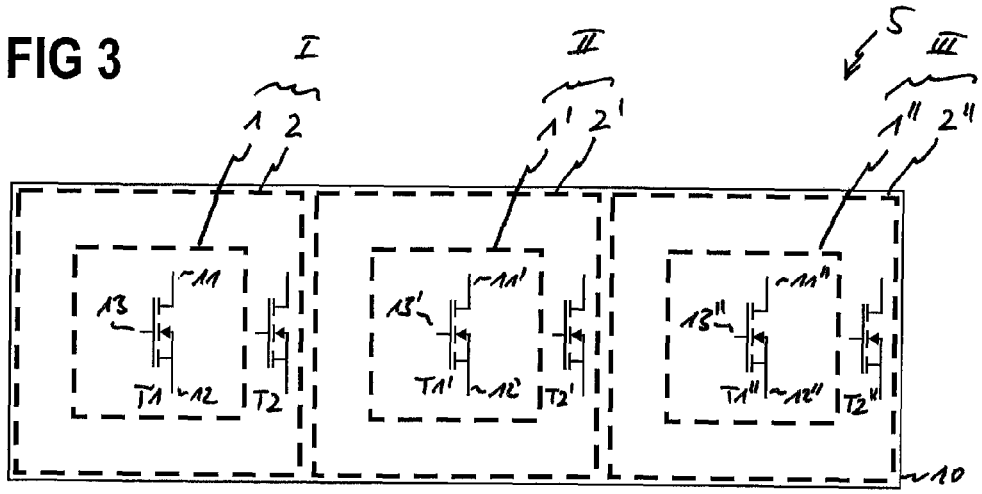
FIG. 3 is a top view of a semiconductor chip which schematically illustrates a semiconductor body that has a number of outer regions each of which surrounds an inner region.

Referring now to FIG. 3, in a semiconductor body 10 of a semiconductor chip 5 a number of N≥2 groups I, II, III each of which has an inner region 1, 1' and 1", respectively, that is surrounded individually by a ring-shaped outer region 2, 2' and 2", respectively, may commonly be accommodated.

The inner region 1 of the first group I, which includes a controllable first electronic component T1, is surrounded by a ring-shaped second electronic component T2. Accordingly, the inner region 1' of the second group II, which includes a controllable first electronic component T1', is surrounded by a ring-shaped second electronic component T2'. Further, the inner region 1" of the third group III, which includes a controllable first electronic component T1', is surrounded by a ring-shaped second electronic component T2'.

In the example of FIG. 3, N=3. However, N may also be 2, 4, 5, 6, etc. The semiconductor chip 5 described with reference to FIGS. 1 and 2 is a special case with N=1.

If, as illustrated in FIG. 3, N is at least 2, each of the groups I, II, III integrated in the semiconductor body 10 may be designed according to an arbitrary embodiment of the group I described with reference to FIGS. 1 and 2. Thereby, in different groups I, II, III, different embodiments may be realized. However, it is also possible that the embodiments realized in two, more or all of the groups I, II, III integrated in the semiconductor body 10 are identical.

Figure 4:
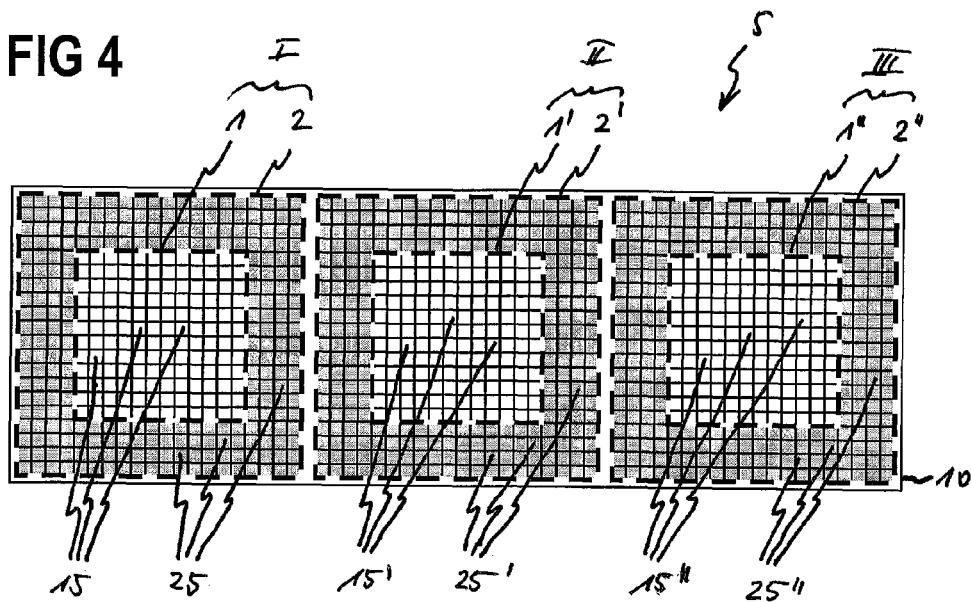
FIG. 4 is a top view of a semiconductor chip according to FIG. 3 which schematically illustrates a controllable first semiconductor component that is arranged in the inner region and that has a cell structure, and a ring-shaped controllable second semiconductor component that is arranged in the outer region and around the inner region, and that has a cell structure.

According to an example illustrated in FIG. 4, both the first electronic components T1, T1', T1" and the second electronic components T2, T2', T2" of each of the N groups may have a cell structure. As can be seen in combination with FIG. 3, the first electronic component T1 of the first group I includes a number of first transistor cells 15 which are electrically connected in parallel and can be controlled via a common first control input 13. Accordingly, the first electronic component T1' of the second group II includes a number of first transistor cells 15' which are electrically connected in parallel and can be controlled via a common first control input 13', and the first electronic component T1" of the third group III includes a number of first transistor cells 15" which are electrically connected in parallel and can be controlled via a common first control input 13".

Further, the second electronic component T2 of the first group I includes a number of second transistor cells 25 which are electrically connected in parallel and can be controlled via a common second control input 23. Accordingly, the second electronic component T2' of the second group II includes a number of second transistor cells 25' which are electrically connected in parallel and can be controlled via a common second control input 23', and the second electronic component T2" of the third group III includes a number of second transistor cells 25" which are electrically connected in parallel and can be controlled via a common second control input 23".

As is also illustrated in FIGS. 3 and 4, all groups I, II, III integrated in a common semiconductor body 10 may be arranged in a single row. However, the groups I, II, III, etc. integrated in a common semiconductor body 10 may also be arranged in two or more rows and two or more columns.

According to an exemplary embodiment illustrated in FIG. 5, a semiconductor chip 5 as described above with reference to FIGS. 1 and 2 may be used for firing an airbag 6. To this, the airbag 6 includes a squib 61 which is electrically connected between one (12) of the first load contacts 11, 12 of the first electronic component T1 and one (21) of the second load contacts 21, 22 of the second electronic component T2. If a supply voltage is supplied between the other (11, 22) first and second load contacts, the squib 61 and the airbag 6 can be fired by switching the load paths of both the first and second electronic components T1, T2 via their respective control inputs 13 and 23, respectively, in the conductive state.

As the firing of many squibs 61 requires a constant current, one (here: T1) of the electronic components T1 and T2 may be controlled so as to provide a constant current, whereas the other (here: T2) of the electronic components T1 and T2 is used as a switch that is fully switched "ON", i.e., in a state in which its load path has its minimum resistance $R_{ON}$. In contrast, that one of the electronic components T1, T2 that provides the constant current is normally not fully switched "ON" and therefore develops more waste heat than the other one. Hence, it is a good option to arrange the electronic component that provides the constant current around the other one of the electronic components. In the present example, T1 is the electronic component that provides the constant current and T2 is the switch. Therefore, T2 is arranged around T1.

As can also be seen from FIG. 5, both first load contacts 11, 12 and the first control input 13 of the first electronic component T1 may be connected to external contacts 110 and 120, respectively, of the semiconductor chip 5, that is, contacts that are accessible from outside the semiconductor chip 5. Alternatively or in addition, both second load contacts 21, 22 and the second control input 23 of the second electronic component T2 may be connected to external contacts 210 and 220, respectively, of the semiconductor chip 5. Such external contacts 110, 120, 210, 220 may be realized, e.g., as metallizations formed on the semiconductor body 10.

According to a further embodiment illustrated in FIG. 6, a number N of two or more airbags 6, 6', 6" may be fired via the electronics integrated in a common semiconductor body 10 of a semiconductor chip 5. To this, each of the airbags 6, 6', 6" has an individual squib 61, 61' and 61", respectively, that is electrically connected between one (12, 12', 12") of the first load contacts 11, 11', 11", 12, 12', 12" of the first electronic component T1, T1', T1" of another one of the groups I, II, III illustrated in FIGS. 3 and 4, and one (21, 21', 21") of the second load contacts 21, 21', 21", 22, 22', 22" of the second electronic component T2, T2', T2" of the of the groups I, II, III.

For firing the squibs 61, 61', 61" of an airbag 6, 6', 6", a supply voltage is supplied between the other (11, 11', 11", 22, 22', 22") first and second load contacts of the first and second electronic components T1, T2, T1', T2', T1", T2" of the respective group I, II, III, and the load paths of both the respective first and second electronic components T1, T2, T1', T2', T1", T2" are switched in the conductive state via their respective control inputs 13, 23, 13', 23' and 13", 23", respectively.

Optionally, as each of the groups I, II, III forms, together with the respective squib 61, 61' and 61", respectively, a circuit as explained with reference to FIG. 5, firing of each of the squibs 61, 61', 61" may take place in the same manner as described with reference to FIG. 5 in that in each group I, II, III one of the first and second electronic components provides a constant current and the other one of the first and second electronic components acts as switch.

Depending on the application to be realized, two or more of the squibs 61, 61', 61" may be fired simultaneously or successively.

Figure 7:
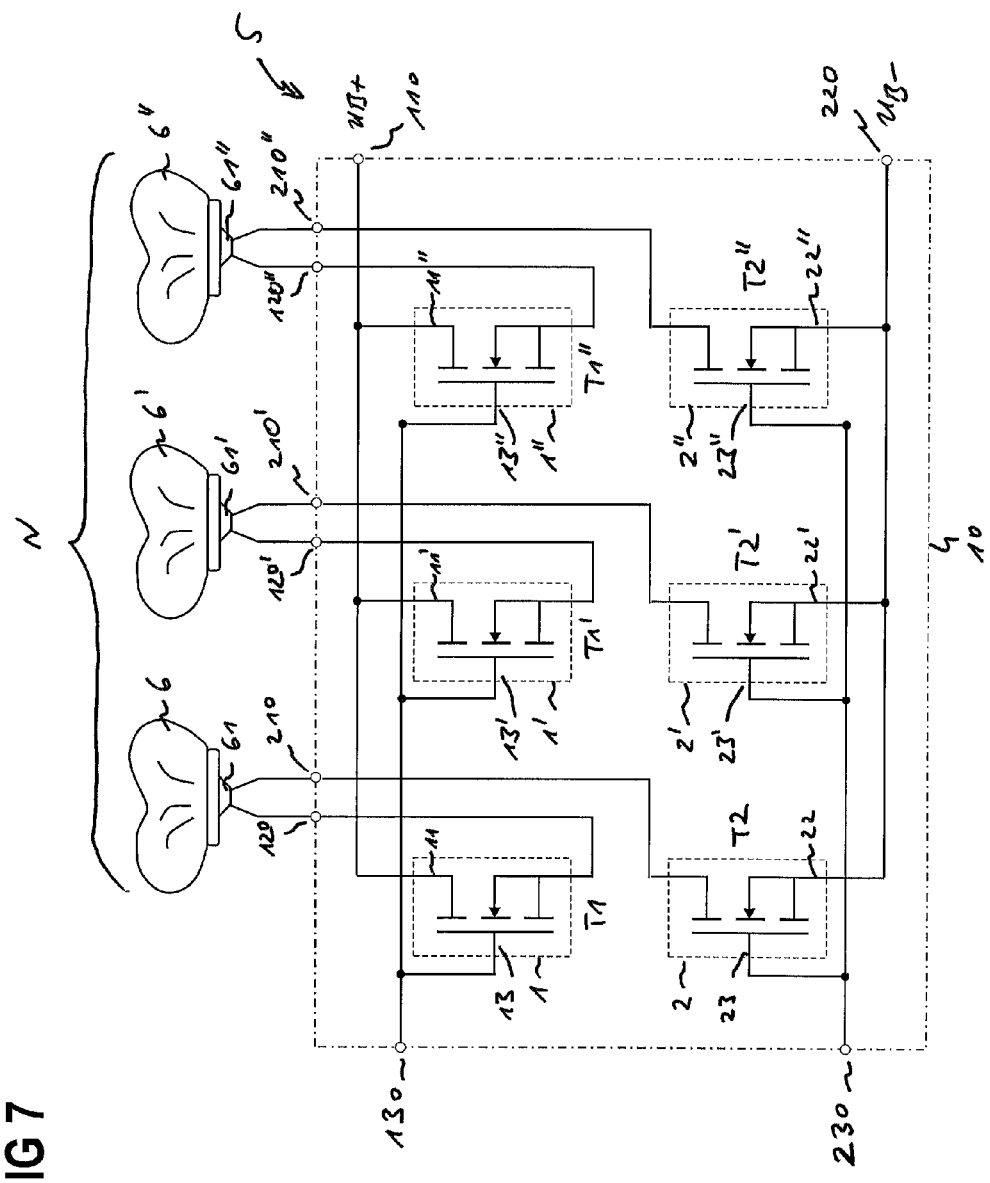
FIG. 7 is a circuit diagram of a modification of the semiconductor arrangement illustrated in FIG. 6.

According to a modification illustrated in FIG. 7, all first and second electronic components T1, T2, T1', T2', T1", T2" integrated in the semiconductor body 10 and the semiconductor chip 5 may be supplied with a common power supply UB+, UB−. To this, the load contacts 11, 11' and 11" may be connected to a common external contact 110 of the semiconductor chip 5, and the load contacts 22, 22' and 22" may be connected to a further common external contact 220 of the semiconductor chip 5. Optionally, UB− may be ground (GND) potential.

Regardless of whether or not the first and second electronic components T1, T2, T1', T2', T1", T2" are supplied with a common power supply, it may be desired that all airbags 6, 6', 6" connected via the respective squibs 61, 61' and 61" to the same semiconductor chip 5 can be fired simultaneously. To this, as is also illustrated in FIG. 7, all control inputs 13, 13' and 13" of the first electronic components T1, T1', T1" may be connected to a common external contact 130 of the semiconductor chip 5, and all control inputs 23, 23' and 23" of the second electronic components T2, T2', T2" may be connected to a further common external contact 230 of the semiconductor chip 5.

Figure 8:
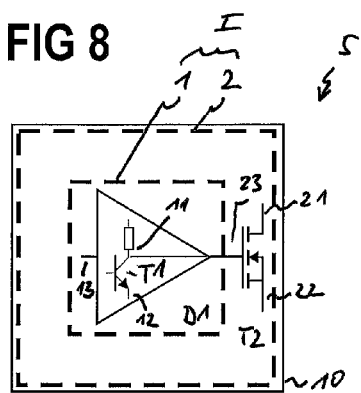
FIG. 8 is a top view of a semiconductor chip with a semiconductor body that schematically illustrates an inner region which includes a driver circuit for driving a controllable ring-shaped field effect transistor that is arranged in the outer region and that surrounds the inner region.

A further embodiment illustrated in FIG. 8 differs from the embodiment explained above with reference to FIGS. 1 and 2 that the inner region 1 includes a driver circuit D1 that is integrated in the inner region 1 and the semiconductor body 10. The driver circuit D1 which can be used for controlling the second electronic component T2 in the outer region 2 has an output that is electrically connected to the control input 23 of the second electronic component T2. For instance, the driver circuit D1 may include a bipolar transistor T1. The transistor T1 has two first load contacts 11, 12, a first load path that is formed between the two first load contacts 11, 12, and a control input 13 for controlling the first load path.

Figure 9:
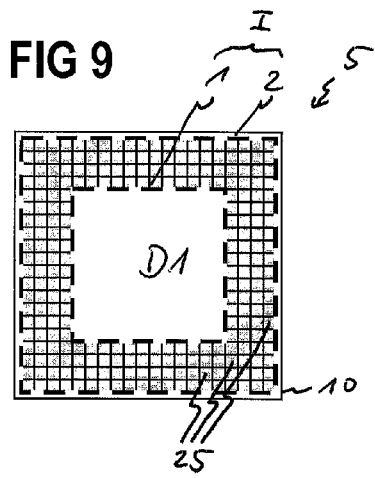
FIG. 9 is a top view of a semiconductor chip according to FIG. 8 which schematically illustrates a ring-shaped controllable second semiconductor component that is arranged in the outer region, that surrounds the inner region, and that has a cell structure, wherein the inner region includes a component that has no cell structure.

As illustrated in FIG. 9 which relates to the same embodiment as FIG. 8, the second electronic component T2 may have a cell structure with a number of second transistor cells 25 which are electrically connected in parallel and can be controlled via a common control input 23 (see FIG. 8) of the second electronic component T2. The transistor cells 25 may be evenly distributed around the inner region 1. However, in other embodiments, the second electronic component T2 may also be a controllable or non controllable ring-shaped electronic component that surrounds the inner region 1.

Figure 10:
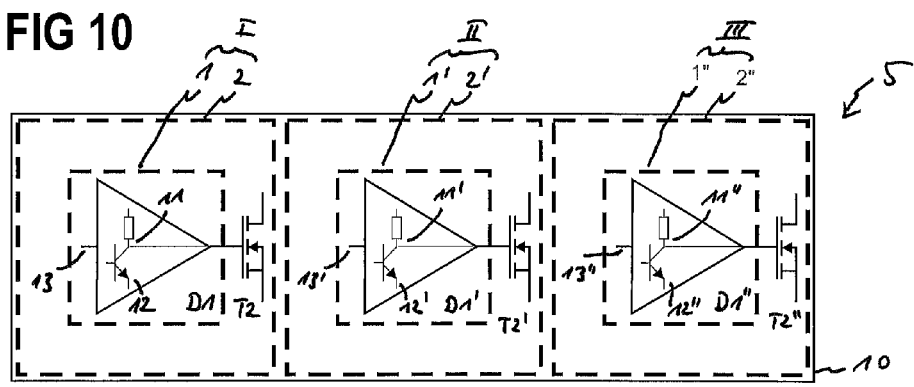
FIG. 10 is a top view of a semiconductor chip that includes a number of groups each of which has an inner region which includes a driver circuit for driving a controllable ring-shaped field effect transistor that surrounds the inner region.

Referring now to FIG. 10, in a semiconductor body 10 of a semiconductor chip 5 a number of N≥2 groups I, II, III each of which has an inner region 1, 1' and 1", respectively, that is surrounded individually by a ring-shaped outer region 2, 2' and 2", respectively, may commonly be accommodated as already described above with reference to FIGS. 3, 4, 6 and 7. In the arrangement of FIG. 10, the inner region 1, 1' and 1" of each of the N groups I, II, III includes a driver circuit D1, D1' and D1", respectively, for driving the second electronic component T2, T2' and T2", respectively, that is arranged in the outer region 2, 2' and 2", respectively, of the same group I, II, III.

Figure 11:
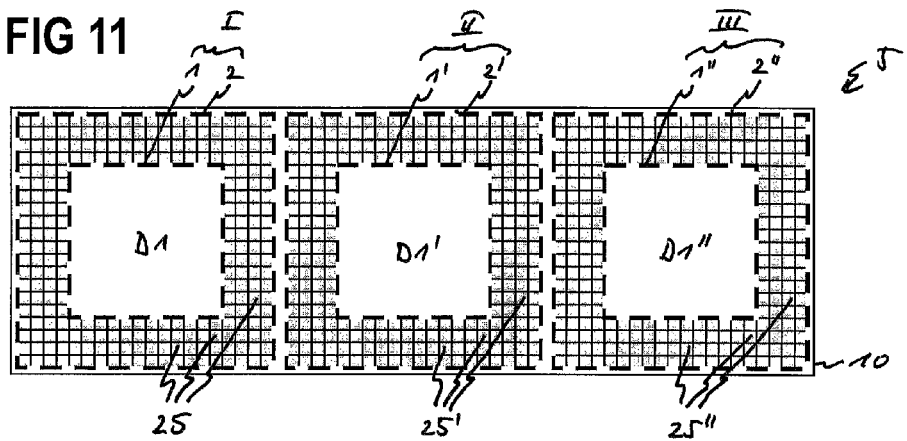
FIG. 11 is a top view of a semiconductor chip according to FIG. 10 which schematically illustrates that each of the ring-shaped field effect transistors has a cell structure.

FIG. 11 illustrates an embodiment according to FIG. 10 in which two, more or all second electronic components T2, T2' and T2" have cell structure as described above with reference to FIG. 4.

Figure 12:
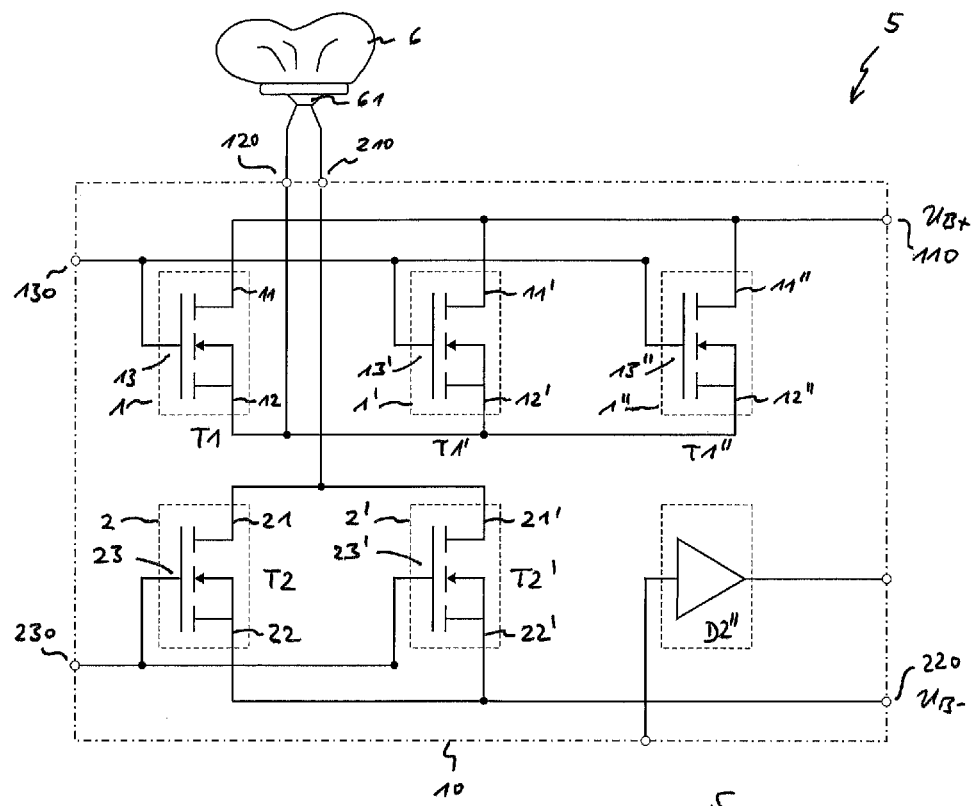
FIG. 12 is a circuit diagram of a modification of a semiconductor arrangement.
Figure 13:
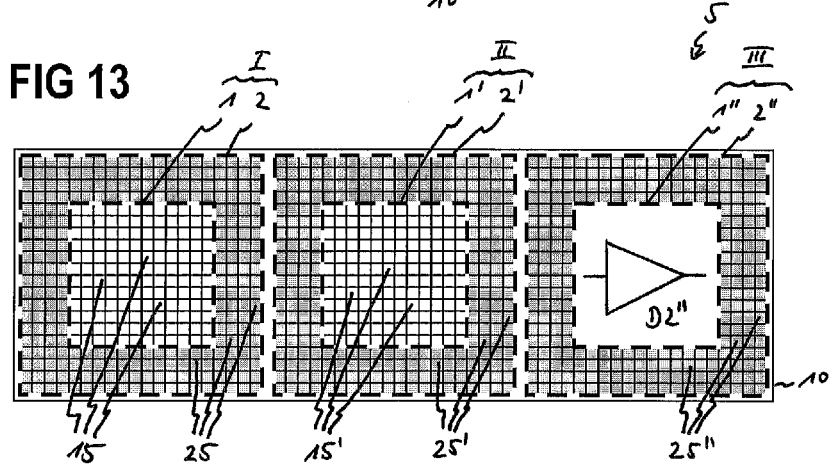
FIG. 13 is a top view of a semiconductor chip according to FIG. 12.

Still a further embodiment is illustrated in FIGS. 12 and 13. FIG. 12 is a circuit diagram that illustrates the circuitry of a semiconductor chip 5 shown in FIG. 13.

A number of N≥2 groups I, II, III each of which has an inner region 1, 1' and 1", respectively, that is surrounded individually by a ring-shaped outer region 2, 2' and 2", respectively, are accommodated in a common semiconductor body 10 of the semiconductor chip 5 as in principle described above with reference to FIGS. 3, 4, 6, 7, 10 and 11.

In the arrangement of FIG. 12, each of a number N2≥2 of the outer regions 2, 2' and 2" includes a first electronic component T1, T1' and T1", respectively. Each of the N1 first electronic components T1, T1', T1" includes a first load path formed between a first load contact 11, 11' and 11", respectively, and a second load contact 12, 12' and 12", respectively. The first load paths are electrically connected in parallel. To this, the first load contacts 11, 11' and 11" are connected to a common external contact 110, the second load contacts 12, 12' and 12" to a common external contact 120. Optionally, each of the first electronic components T1, T1', T1" may have a cell structure.

Further, each of a number N1<N2 of the inner regions 1 and 1' includes a second electronic component T2 and T2', respectively. Each of the N2 second electronic components T2 and T2' includes a second load path formed between a first load contact 21 and 21', respectively, and a second load contact 22 and 22', respectively. The second load paths are electrically connected in parallel. To this, the first load contacts 21 and 21' are connected to a common external contact 210, the second load contacts 22 and 22' to a common external contact 220. Optionally, each of the N2 second electronic components T2, T2' may have a cell structure. However, arbitrary structures other than cell structures are also possible.

As illustrated in FIG. 12, a squib 61 of an airbag 6 may be electrically connected between the external contacts 120 and 210. The parallel connection between the first electronic components T1, T1' and T1" serve to provide the squib 6 with a constant current as soon as the parallel connection between the second electronic components T2, T2', which serves as switch, is switched "ON". Compared to the arrangement as explained with reference to FIG. 5, the power loss of T1 in FIG. 5 is distributed to a number N1>1 of parallel connected first electronic components T1, T1', T1" which results in a more even temperature distribution over the semiconductor body 10.

Optionally, in at least one (III) of the groups I, II, III, the inner region 1" may be used to accommodate one or more further electronic components which in FIGS. 12 and 13 are exemplarily represented by a driver D2". One or more of these more further electronic components may have a structure as the first electronic components 1 in the examples of FIGS. 8, 9, 10, 11 and may relate to its enclosing second electronic component 2" in the same manner as the first electronic components 1 in the examples of FIGS. 8, 9, 10, 11 to the respective enclosing second electronic component 2.

Figure 14:
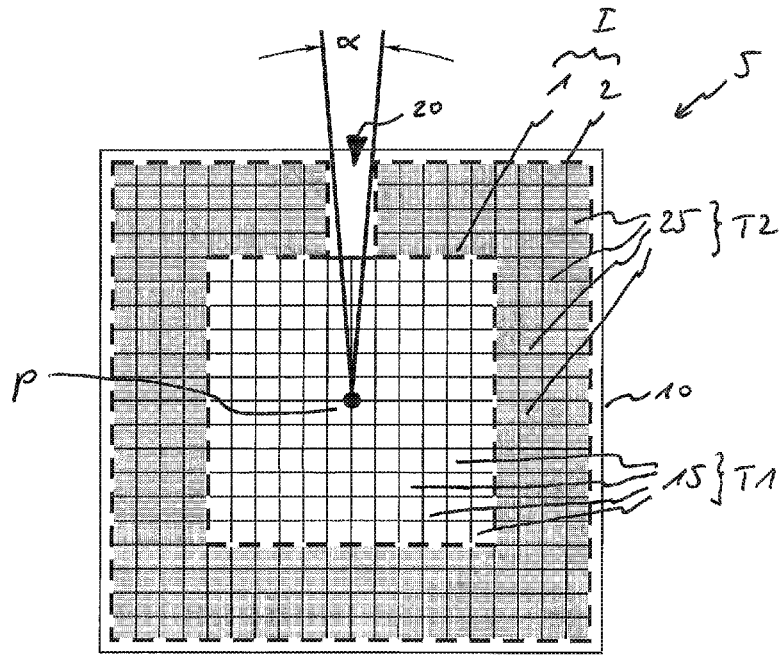
FIG. 14 is a top view of a semiconductor chip according to FIG. 2 with the difference that the second component is formed as an open ring.
Figure 15:
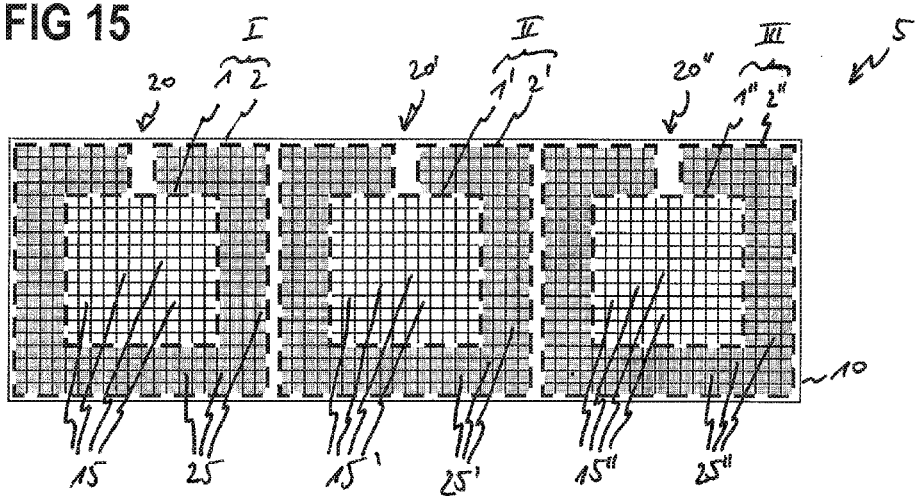
FIG. 15 is a top view of a semiconductor chip according to FIG. 4 with the difference that the second components are formed as open rings.

In the embodiments explained above, the ring-shaped second components 2, 2', 2" were formed as closed rings. Alternatively, as exemplarily illustrated in FIG. 14, a ring-shaped second component 2 may have opening 20 such that is forms an open ring. In the sense of the present invention, a second component 2 is regarded as "ring-shaped" if it either is formed as a closed ring or if it has an opening 20 such that there is a point P surrounded by that second component 2 from which point P the opening 20 appears at an angle α of less than or equal to 180°, of less than or equal to 90°, or of less than or equal to 45°. In this sense, any ring-shaped second component 2, 2', 2" of a semiconductor chip 5 of the present invention may be formed, independently from the shape of any other ring-shaped second component 2, 2', 2" of the same semiconductor chip 5, as a closed or open ring. An example is illustrated in FIG. 15 which is a top view of a semiconductor chip according to FIG. 4 with the difference that each of the second components 2, 2', 2" is formed as an open ring and has an opening 20, 20' and 20", respectively.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper," and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc., and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an," and "the," are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents. In particular, the features/method steps of different embodiments may be combined in an arbitrary manner unless the combination of certain features/method steps is technically impossible.

What is claimed is:

1. A semiconductor chip comprising:
   a semiconductor body comprising an inner region and a ring-shaped outer region that surrounds the inner region;
   an electronic structure that is monolithically integrated in the inner region and that comprises a controllable first semiconductor component with a first load path and a first control input for controlling the first load path;
   a ring-shaped second semiconductor component that is monolithically integrated in the ring-shaped outer region and comprises a second load path, the ring-shaped second semiconductor component surrounding the inner region, wherein the ring-shaped second semiconductor component is a transistor that comprises a cell structure with a plurality of second transistor cells that are evenly distributed over the ring-shaped outer region and that have conduction paths electrically connected in parallel to form the second load path;
   wherein the first load path and the second load path are not electrically connected in parallel; and
   wherein at least one of the first semiconductor component and the second semiconductor component is a DMOS transistor.

2. The semiconductor chip as claimed in claim 1, wherein the second semiconductor component is an active electronic component that comprises a second control input for controlling the second load path.

3. The semiconductor chip as claimed in claim 2, wherein one or both of the following applies:
   the first semiconductor component and the second semiconductor component are controllable via their respective control inputs independently from one another; and/or
   the first control input and the second control input are electrically insulated from one another.

4. The semiconductor chip as claimed in claim 1, wherein the first semiconductor component comprises a component selected from the group consisting of a field effect transistor, a bipolar transistor, and a thyristor.

5. The semiconductor chip as claimed in claim 1, wherein the first semiconductor component is:
   a transistor that does not comprise a structure with a plurality of transistor cells; or
   a DMOS transistor; or
   a MOSFET; or
   an IGBT; or
   a J-FET.

6. The semiconductor chip as claimed in claim 1, wherein the first semiconductor component is a transistor that comprises a first cell structure with a plurality of first transistor cells.

7. The semiconductor chip as claimed in claim 6, wherein the first transistor cells are electrically connected in parallel.

8. The semiconductor chip as claimed in claim 1, wherein the second semiconductor component comprises a component selected from the group consisting of a field effect transistor, a bipolar transistor, and a thyristor.

9. The semiconductor chip as claimed in claim 1, wherein the second semiconductor component comprises a component selected from the group consisting of a MOSFET, an IGBT, a J-FET, and a DMOS transistor.

10. The semiconductor chip as claimed in claim 1, wherein the second semiconductor component comprises a diode, or a resistor.

11. The semiconductor chip as claimed in claim 8, wherein:
    the first semiconductor component comprises an n-channel field effect transistor; and
    the second semiconductor component comprises an n-channel field effect transistor.

12. The semiconductor chip as claimed in claim 1, wherein the ring-shaped second semiconductor component is formed as a closed or a non-closed ring.

13. A semiconductor arrangement comprising:
    a squib for firing an airbag; and
    a semiconductor chip that comprises:
       a semiconductor body comprising an inner region and a ring-shaped outer region;
       a first electronic structure that is monolithically integrated in the inner region and that comprises a controllable first semiconductor component with two first load contacts, with a first load path formed between the two first load contacts, and with a first control input for controlling the first load path;
       a ring-shaped second electronic structure that is monolithically integrated in the outer region and that comprises a controllable ring-shaped second semiconductor component with two second load contacts, with a second load path formed between the two second load contacts, and with a second control input for controlling the second load path, wherein the ring-shaped second semiconductor component is a field effect transistor that comprises a second cell structure with a plurality of second transistor cells that are evenly distributed over the ring-shaped outer region and that have conduction paths electrically connected in parallel to form the second load path;
       wherein the squib is electrically connected between one of the first load contacts and one of the second load contacts; and
       wherein at least one of the first semiconductor component and the second semiconductor component is a DMOS transistor.

14. The semiconductor arrangement as claimed in claim 13 wherein:
    the first semiconductor component is a field effect transistor that comprises a first cell structure with a plurality of first transistor cells that are evenly distributed over the inner region and electrically connected in parallel.

15. A method for operating a semiconductor chip, the method comprising:
- providing a semiconductor chip and a supply voltage;
- connecting the semiconductor chip to the supply voltage;
- wherein the semiconductor chip comprises:
    - an inner region and a ring-shaped outer region;
    - an electronic structure that is monolithically integrated in the inner region and that comprises a controllable first semiconductor component with a first load path and a first control input for controlling the first load path;
    - a ring-shaped second electronic component that is monolithically integrated in the outer region, that surrounds the inner region, and that comprises a ring-shaped second semiconductor component and a second load path, wherein the ring-shaped second semiconductor component is a transistor that comprises a cell structure with a plurality of second transistor cells that are evenly distributed over the ring-shaped outer region and that have conduction paths electrically connected in parallel to form the second load path;
    - wherein the first load path and the second load path are not electrically connected in parallel;
    - wherein a first maximum temperature of the semiconductor chip occurs in the outer region and wherein a second maximum temperature of the inner region is less than the first maximum temperature; and
    - wherein at least one of the first semiconductor component and the second semiconductor component is a DMOS transistor.

16. The method as claimed in claim 15, wherein the difference between the first maximum temperature and the second maximum temperature is at least 10° C. or at least 20° C.

* * * * *